United States Patent
Roberts, Jr. et al.

(10) Patent No.: US 12,061,231 B2
(45) Date of Patent: Aug. 13, 2024

(54) DEVICE INTERFACE BOARD COMPLIANCE TESTING USING IMPEDANCE RESPONSE PROFILING

(71) Applicant: CELERINT, LLC, New York, NY (US)

(72) Inventors: Howard H. Roberts, Jr., San Antonio, TX (US); LeRoy Growt, Pflugerville, TX (US)

(73) Assignee: CELERINT, LLC, New York, NY (US)

( * ) Notice: Subject to any disclaimer, the term of this patent is extended or adjusted under 35 U.S.C. 154(b) by 292 days.

(21) Appl. No.: 17/603,767

(22) PCT Filed: Apr. 14, 2020

(86) PCT No.: PCT/US2020/028092
§ 371 (c)(1),
(2) Date: Oct. 14, 2021

(87) PCT Pub. No.: WO2020/214575
PCT Pub. Date: Oct. 22, 2020

(65) Prior Publication Data
US 2022/0236325 A1    Jul. 28, 2022

Related U.S. Application Data

(60) Provisional application No. 62/834,524, filed on Apr. 16, 2019.

(51) Int. Cl.
*G01R 31/317* (2006.01)
*H04L 7/00* (2006.01)

(52) U.S. Cl.
CPC . *G01R 31/31703* (2013.01); *G01R 31/31725* (2013.01); *H04L 7/0091* (2013.01)

(58) Field of Classification Search
CPC ......... G06F 1/12; G06F 11/261; G01D 3/032; G01D 5/244; G01D 18/001; G01D 5/2449;
(Continued)

(56) References Cited

U.S. PATENT DOCUMENTS

| 4,837,521 A | 6/1989 | Herlein et al. |
| 6,052,810 A * | 4/2000 | Creek ............. G01R 31/31924 714/724 |

(Continued)

OTHER PUBLICATIONS

International Search Report, mailed Jul. 6, 2020 by the USPTO, in International Application No. PCT/US2020/028092.
Written Opinion of the International Searching Authority, mailed Jul. 6, 2020 by the USPTO, in International Application No. PCT/US2020/028092.

*Primary Examiner* — Vinh P Nguyen
(74) *Attorney, Agent, or Firm* — GREENBLUM & BERNSTEIN P.L.C.

(57) ABSTRACT

A method for compliance testing of a Digital Interface Board attached to Automatic Test Equipment in the testing of integrated circuit semiconductor devices using Impedance Response Profiling. The includes launching alternating voltage digital clock signals from the Pin Electronics to one or more circuit paths in the Digital Interface Board, and sampling a mix of the launched alternating voltage digital clock signals and reflected signals. The method also includes compositing time domain waveforms originating at the Pin Electronics, and generating an initial reflection response profile baseline. The method is repeated at a later predetermined time, generating a later reflection response profile. The method further includes comparing the initial reflection response profile baseline with the later reflection response profile, and determining whether the one or more circuit paths of the Digital Interface Board are in compliance with predetermined operating standards.

20 Claims, 14 Drawing Sheets

(58) Field of Classification Search
CPC ........ H03M 1/12; H03M 1/66; H03M 1/1052; H03M 1/06; H03M 1/1038; H03M 1/109; H03M 1/1095; G01R 31/2834; G01R 35/00; G01R 31/2889; G01R 31/31905; G01R 31/3191; G01R 31/28; G01R 35/005; G01R 31/287; G01R 31/2837; G01R 31/2882; G01R 31/318357; G01R 31/31901; G01R 31/31926; G01R 31/31922; G01R 31/31725; G01R 31/11; G01R 31/2836; G01R 31/318594; G01R 31/31859

See application file for complete search history.

(56) References Cited

U.S. PATENT DOCUMENTS

| | | | |
|---|---|---|---|
| 6,998,834 B2 * | 2/2006 | Agoston | G01R 31/2841 |
| | | | 324/76.15 |
| 7,102,375 B2 * | 9/2006 | Walker | G01R 31/2844 |
| | | | 714/724 |
| 9,164,158 B2 * | 10/2015 | Johnson | G01R 31/3191 |
| 11,555,856 B2 * | 1/2023 | Roberts, Jr. | G01R 35/00 |
| 11,619,667 B2 * | 4/2023 | Su | G01R 31/31716 |
| | | | 714/738 |
| 2002/0145435 A1 | 10/2002 | Bald et al. | |
| 2005/0057257 A1 | 3/2005 | Fleischman | |

* cited by examiner

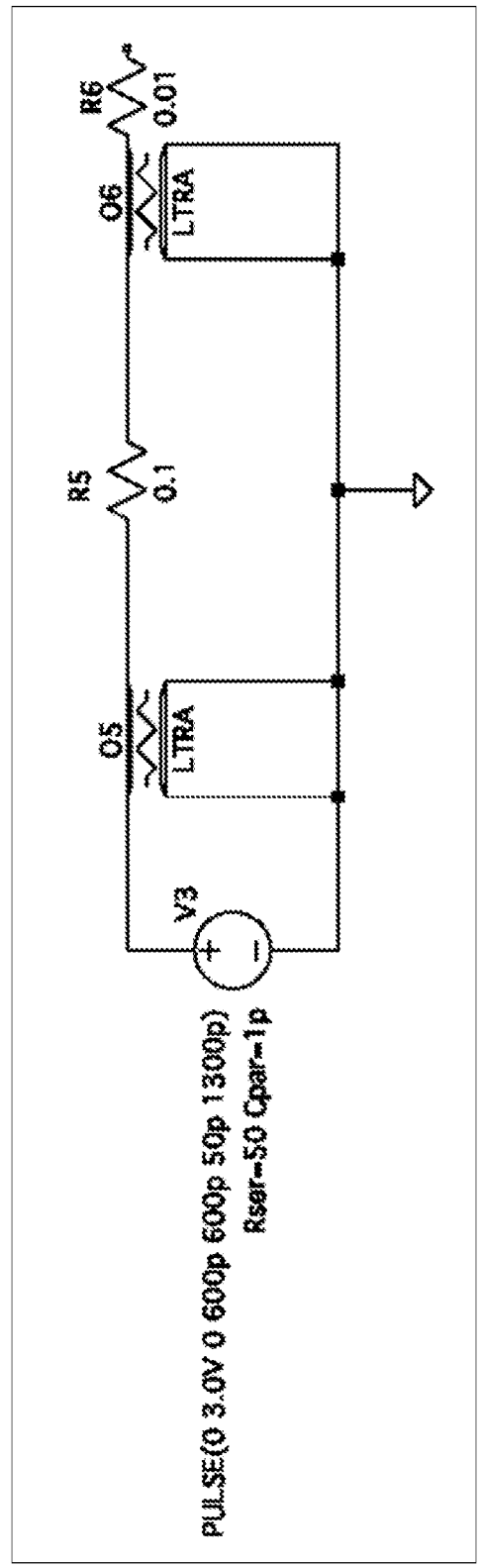
FIG. 5A – Contact Resistance

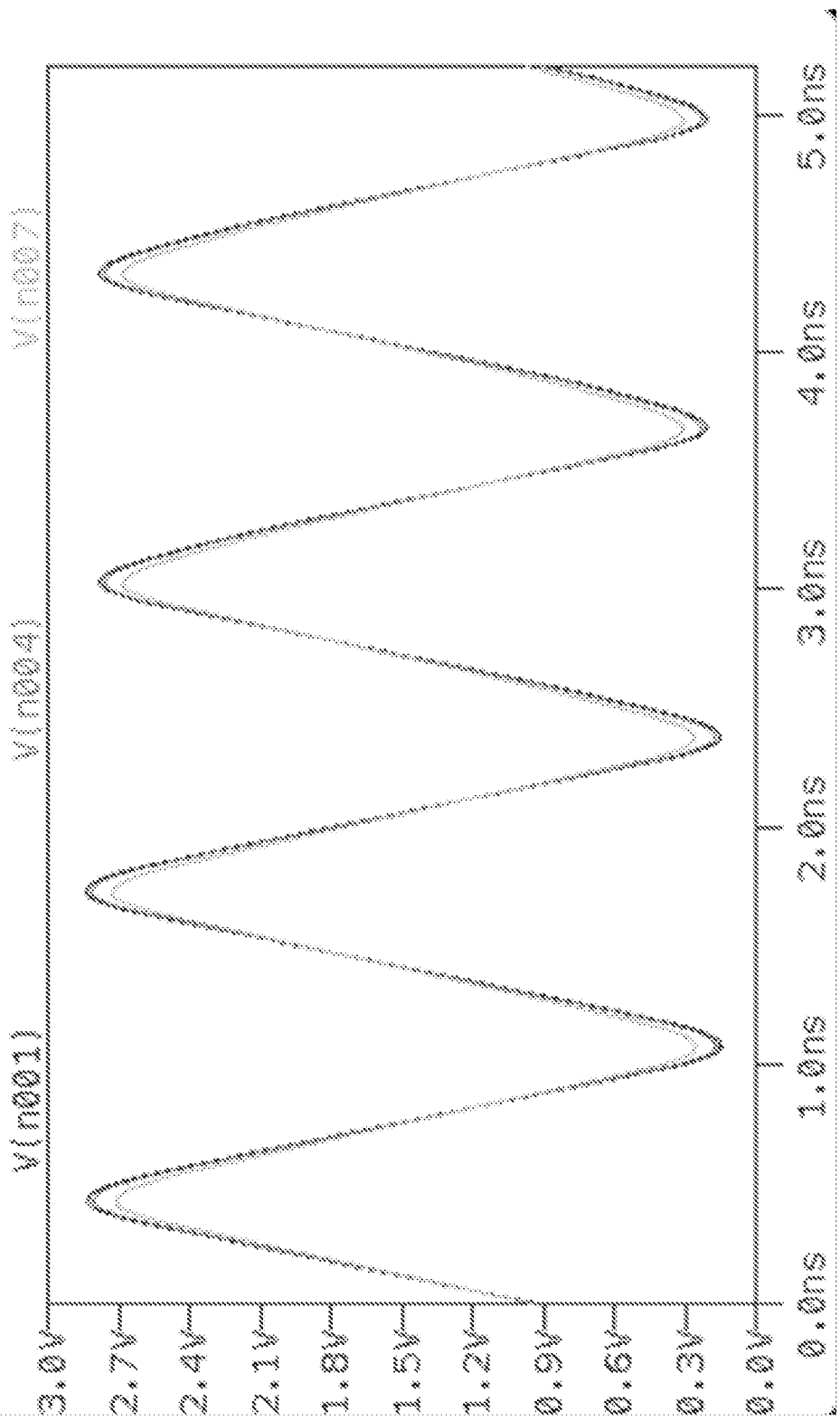
FIG. 5B – Contact Resistance Waveforms

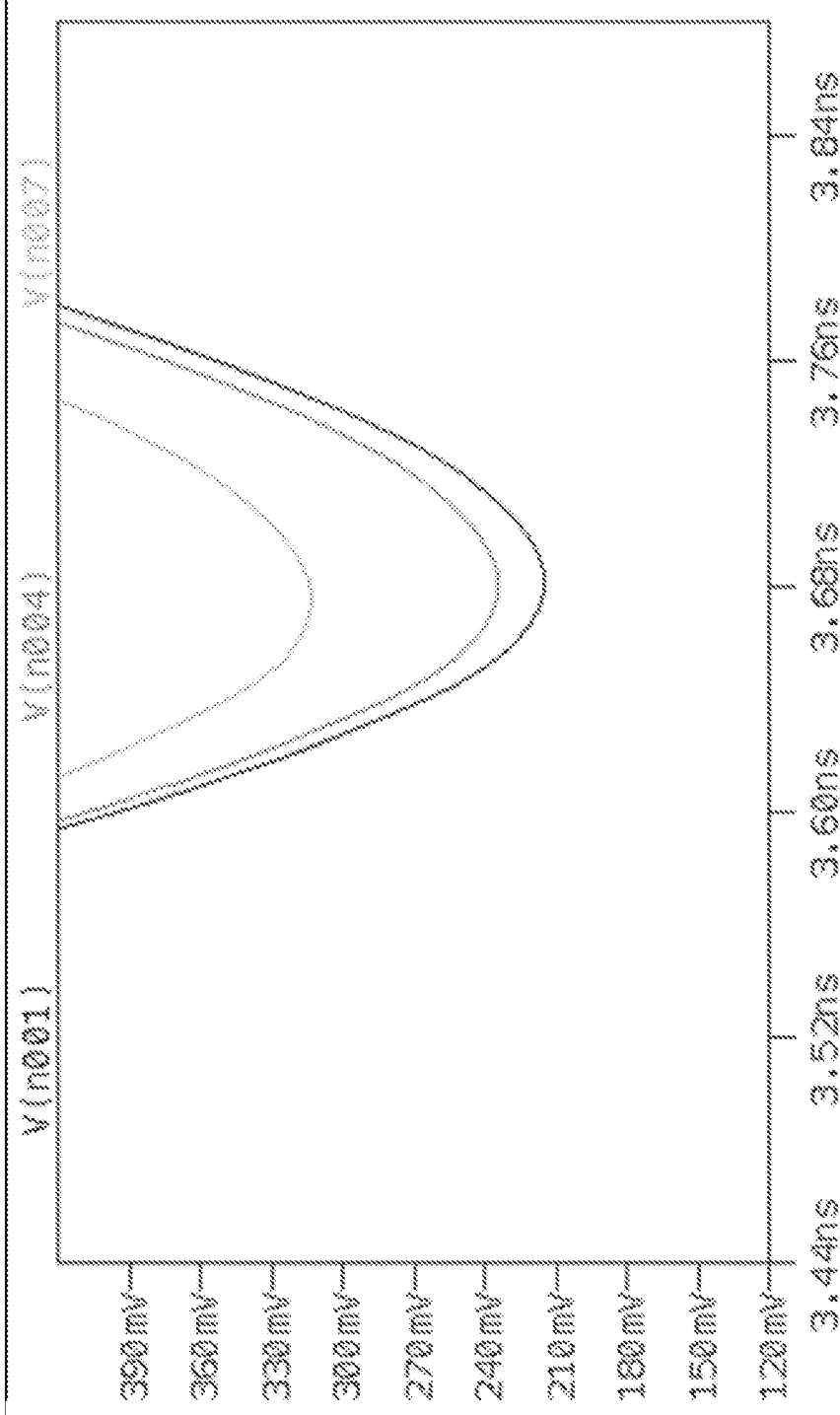
FIG. 5C – Contact Resistance Waveforms

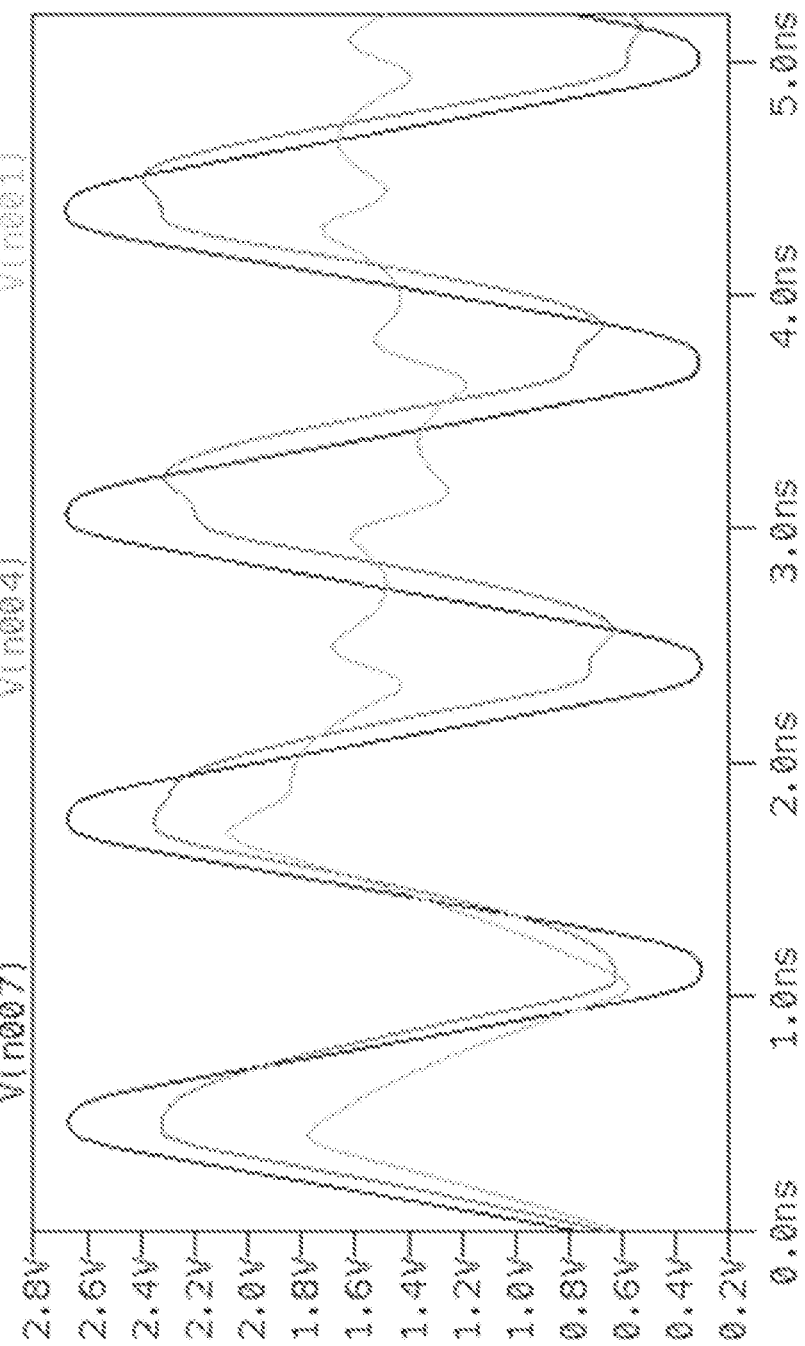

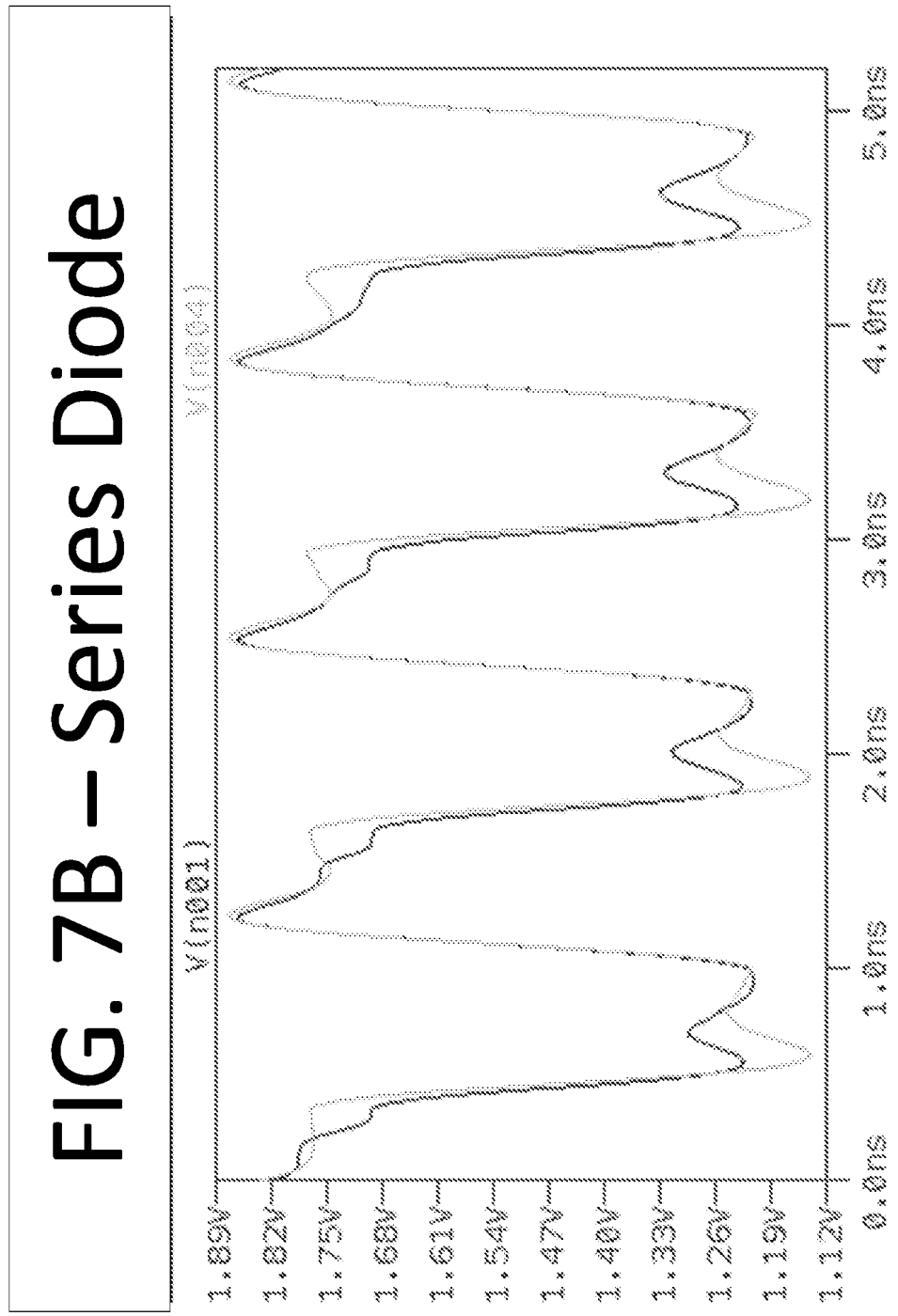
FIG. 7B – Series Diode

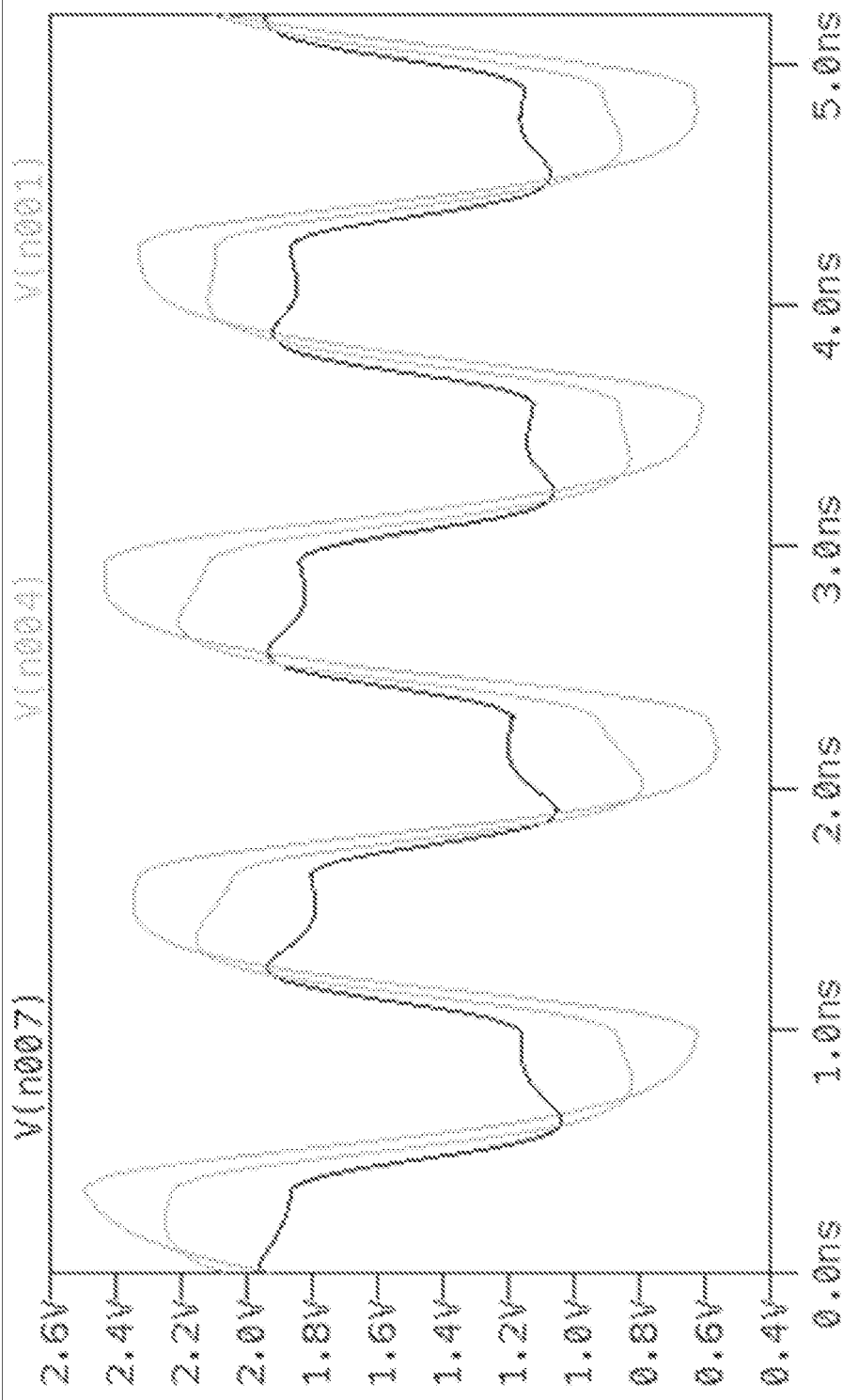
FIG. 8B – High Pass RC Filter Waveforms

DEVICE INTERFACE BOARD COMPLIANCE TESTING USING IMPEDANCE RESPONSE PROFILING

CROSS-REFERENCE TO RELATED APPLICATION

This application claims the benefit of U.S. Provisional Patent Application No. 62/834,524 entitled "DIB Compliance Testing Using Impedance Response Profiling (IRP)," filed on Apr. 16, 2019, the disclosure of which is incorporated by reference herein in its entirety.

TECHNICAL FIELD

The present disclosure is related to automated manufacturer systems and methods, particularly automated semiconductor test equipment. In particular, the present disclosure is directed to a novel method of testing a digital interface board (DIB) for compliance with testing standards.

BACKGROUND

Integrated circuit semiconductor devices must be tested to ensure that they meet operational standards. Testing takes place at various stages of manufacturing and operation. In order to test an integrated circuit device, the integrated circuit device must be electrically connected to a test system. The most common method employs a DIB (Digital Interface Board) or a DUT (Device Under Test) interface board. Such a board is a printed circuit board that facilitates electrical testing of the DUT (Device Under Test) by providing a receptacle to hold the DUT (Device Under Test) and to provide an electrical interconnection between the DUT and the tester.

IC testing is a complex enterprise. At all points during the process, the hardware and software used in testing must produce accurate and repeatable results. This means that the automated test equipment or ATE must be calibrated and compliant, the software must be validated, and the DUT interface hardware must also be calibrated and compliant.

As the complexity of integrated circuits has grown, so has the complexity of the DIB. The DIB may consist of an array of active and passive components such as resistors, capacitors, inductors, filters, op amps, switches (relays), and other integrated circuits. Testing of the DIB can be complex in itself. In most cases, active circuits are tested using loopback methods to the tester. However, it is not practical in terms of board layout and complexity to provide a loopback path in order to test all circuits and components on a DIB. In order to avoid electrical stubs that degrade signal integrity, loopback paths must be isolated during device testing by using an isolation switch. It is simply not practical to provide an isolation switch for every circuit path on the DIB. Consequently, the most common method to detect degraded DIB performance or even catastrophic failure is to monitor the test yield. If the test yield drops below an expected level, then the DIB along with other parts of the system must be excluded as the source of the degraded yield. This common method is worrisome because it does not screen for a different problem, which is the test escape or false pass result. As a result of these factors, there exists a need in the manufacture and testing of semiconductors for an efficient and accurate method for DIB testing.

Ideally, DIB testing is short in duration and can be performed while the DIB is connected to the tester with or without a DUT being inserted into the test socket. The motivation is to avoid having to remove the board from production for testing, either manually or by automation.

Although there are many schemes and methods attempting to accomplish this goal for DIB testing, a novel approach that is particularly effective and efficient will be described herein. This new process can be used on both legacy and new DIBs, because no special DIB components or circuit paths are required. This new process can be used not only to detect catastrophic failures, but it can also be used to detect component drift as a means for early detection of failure.

Manufacturing and production industries use automatic test equipment (ATE) to analyze and assess integrity and operability of manufactured products at various stages of production. Because many diverse types of DUTs are tested by ATEs, and DUTs may be tested at various stages of production (e.g., final test, work piece probe, etc.), ATEs are varied in design according to the particular purpose, device, and/or product for testing.

Although varied, ATEs include several typical operational units. ATEs and robotic manipulators are widely used, for example, in the production of electronic products, such as analog and digital components, circuits and devices (including semiconductors, integrated circuits, microprocessors, and the like).

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board) connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

When signal switches, such as electromechanical relays or solid state relays, are added to the signal path of an electrical test circuit, the signal switches introduce the possibility of false results, particularly when they fail. Functional failure modes for malfunctioning switches include, but are not limited to, "stuck closed" and "stuck open." In both cases, the signal switch fails to respond to the control input and change its state.

SUMMARY

As discussed above, the present disclosure is related to automated manufacturer systems and methods, particularly automated semiconductor test equipment. In particular, the present disclosure is directed to a novel method of testing a digital interface board (DIB) for compliance with testing standards.

In an embodiment, a method is provided for compliance testing of a Digital Interface Board attached to Automatic Test Equipment in the testing of integrated circuit semiconductor devices using Impedance Response Profiling. The method includes launching alternating voltage digital clock signals from the Pin Electronics to one or more circuit paths in the Digital Interface Board, and sampling a mix of the launched alternating voltage digital clock signals and reflected signals. The method also includes compositing time domain waveforms originating at the Pin Electronics, and generating an initial reflection response profile baseline. The method is repeated at a later predetermined time, generating a later reflection response profile. The method further includes comparing the initial reflection response profile baseline with the later reflection response profile, and determining whether the one or more circuit paths of the Digital Interface Board are in compliance with predetermined operating standards.

In another embodiment, the comparing includes determining whether the initial reflection response profile baseline and the later reflection response profile are identical.

In a further embodiment, the comparing includes determining whether the later reflection response profile is within predetermined upper tolerance limit and a predetermined lower tolerance limit when compared to the initial reflection response profile baseline.

In an embodiment, the comparing is executed by a digital processor.

In another embodiment, the Device Interface Board is compliance tested without any Device Under Test being in electrical contact with the Device Interface Board.

In a further embodiment, the Device Interface Board is compliance tested with one or more Devices Under Test being in electrical contact with the Device Interface Board.

In an embodiment, the method includes determining a Fast Fourier Transform of the periodic reflected signal signals.

In another embodiment, the method further includes repairing a Digital Interface Board determined to be outside an acceptable tolerance zone located between a predetermined upper tolerance limit and a predetermined lower tolerance limit when compared to the initial reflection response profile baseline.

In a further embodiment, the method further includes replacing a Digital Interface Board determined to be outside the acceptable tolerance zone located between a predetermined upper tolerance limit and a predetermined lower tolerance limit when compared to the initial reflection response profile baseline.

In an embodiment, the repairing Digital Interface Board includes determining the Mean Time Between Failure of each circuit element included in a circuit path determined to be outside of an acceptable tolerance range.

In another embodiment, the method further includes determining whether a circuit path of the Digital Interface Board determined not to be in compliance with predetermined operating standards has experienced a catastrophic failure.

In a further embodiment, the determining whether the circuit path has experienced a catastrophic failure includes testing for an electrical short circuit, an electrical open circuit, and a non-compliance of a critical electrical characteristic of a circuit element.

In an embodiment, the method includes determining whether a circuit path of the Digital Interface Board determined not to be in compliance with predetermined operating standards has experienced an unacceptable parametric drift of operating parameters.

In another embodiment, the determining whether the circuit path has experienced an unacceptable parametric drift of operating parameters includes testing the capacitance of capacitors, the resistance of resistors, the inductance of inductors, the voltage threshold of diodes, and the contact resistance of switches and interconnects located in the circuit path.

In a further embodiment, a system is provided for compliance testing of a Digital Interface Board used in the testing of integrated circuit semiconductor devices. The system includes Automatic Test Equipment (ATE), including at least one processor and an ATE System Test Head, a Device Interface Board in electrical contact with the ATE System Test Head via POGO pins, and at least one test socket in the Device Interface Board for testing at least one Device under Test. The ATE is configured to perform compliance testing of the Digital Interface Board. The compliance testing includes launching alternating voltage digital clock signals via Pin Electronics to one or more circuit paths in the Digital Interface Board, and sampling a mix of the launched alternating voltage digital clock signals and reflected signals. The compliance testing also includes compositing time domain waveforms via the Pin Electronics, and generating an initial reflection response profile baseline. In the compliance testing, the compliance testing is repeated at a later predetermined time, thereby generating a later reflection response profile. The compliance testing further includes comparing the initial reflection response profile baseline with the later reflection response profile, and determining whether the one or more circuit paths of the Digital Interface Board are in compliance with predetermined operating standards.

In an embodiment of the system, the comparing includes determining whether the initial reflection response profile baseline and the later reflection response profile are identical.

In another embodiment of the system, the comparing includes determining whether the later reflection response profile is within predetermined upper tolerance limit and a predetermined lower tolerance limit when compared to the initial reflection response profile baseline.

In a further embodiment of the system, the Device Interface Board is compliance tested without any Device Under Test being in electrical contact with the Device Interface Board.

In an embodiment of the system, the Device Interface Board is compliance tested with one or more Devices Under Test being in electrical contact with the Device Interface Board.

In another embodiment, a non-transitory computer-readable storage medium is provided that stores one or more computer programs, which when executed by one or more processors in Automatic Test Equipment, cause the one or more processors to execute operations for compliance testing of a Digital Interface Board in the testing of integrated circuit semiconductor devices, using Impedance Response Profiling. The operations include launching alternating voltage digital clock signals from Pin Electronics to one or more circuit paths in the Digital Interface Board, and sampling a mix of the launched alternating voltage digital clock signals and reflected signals. The operations also include compositing time domain waveforms originating at the Pin Electronics, and generating an initial reflection response profile baseline. The compliance testing is repeated at a later predetermined time. The initial reflection response profile baseline is then compared with the later reflection response profile, a determination is made whether the one or more circuit paths of the Digital Interface Board are in compliance with predetermined operating standards.

BRIEF DESCRIPTION OF THE DRAWINGS

FIG. 5A illustrates circuitry used in a simulation to show the response of contact resistance to a voltage stimulus;

FIG. 5B and FIG. 5C show IPR contact resistance waveforms using the simulation circuitry illustrated in FIG. 5A;

FIG. 6B shows IPR AC coupling capacitance waveforms using the simulation circuitry illustrated in FIG. 6A;

FIG. 7B shows IPR series diode waveforms using the simulation circuitry illustrated in FIG. 7A;

FIG. 8B shows IPR high pass RC filter waveforms using the simulation circuitry illustrated in FIG. 8A.

DETAILED DESCRIPTION

In view of the foregoing, the present disclosure, through one or more of its various aspects, embodiments and/or specific features or sub-components, is thus intended to bring out one or more of the advantages as specifically noted below.

During the description of the invention, a number of acronyms will be used. Thus, the following Glossary provides definitions of notable acronyms:

IRP: Impedance Response Profile (the process described herein)
ATE: Automatic Test Equipment, testers, and device handlers
DUT: Device Under Test, the semiconductor device(s) inserted into a test socket(s) and undergoing electrical and functional testing
PCB: Printed Circuit Board, a planar piece of hardware that mechanically supports and electrically connects components in a system of communicative and interactive electronics
DIB: DUT Device Interface Board (also known as a "load board"), the PCB and test sockets that interface the semiconductor device under test by the ATE (the tester)
IC: Integrated Circuit, digital tester resource used for testing digital ICs
PE: Pin Electronics, digital tester resource used for testing digital ICs
TDR: Time Domain Reflectometry, an electrical test method to determine signal transit time (used to perform timing de-skew on digital signals)
SPICE: an electrical simulation application
MTBF: Mean Time Between Failures
FFT: Fast Fourier Transform, a method used to identify frequency components in a complex signal
AC: Alternating current, a signal that alternates between a high and a low voltage with an alternating current associated with those two voltages In order to test an integrated circuit device, the integrated circuit device must be electrically connected to a test system. The most common method employs a DIB (Digital Interface Board) or a DUT (Device Under Test) interface board. Such a board is a printed circuit board that facilitates electrical testing of the DUT (Device Under Test) by providing a receptacle to hold the DUT (Device Under Test) and to provide an electrical interconnection between the DUT and the tester.

Figure 1:
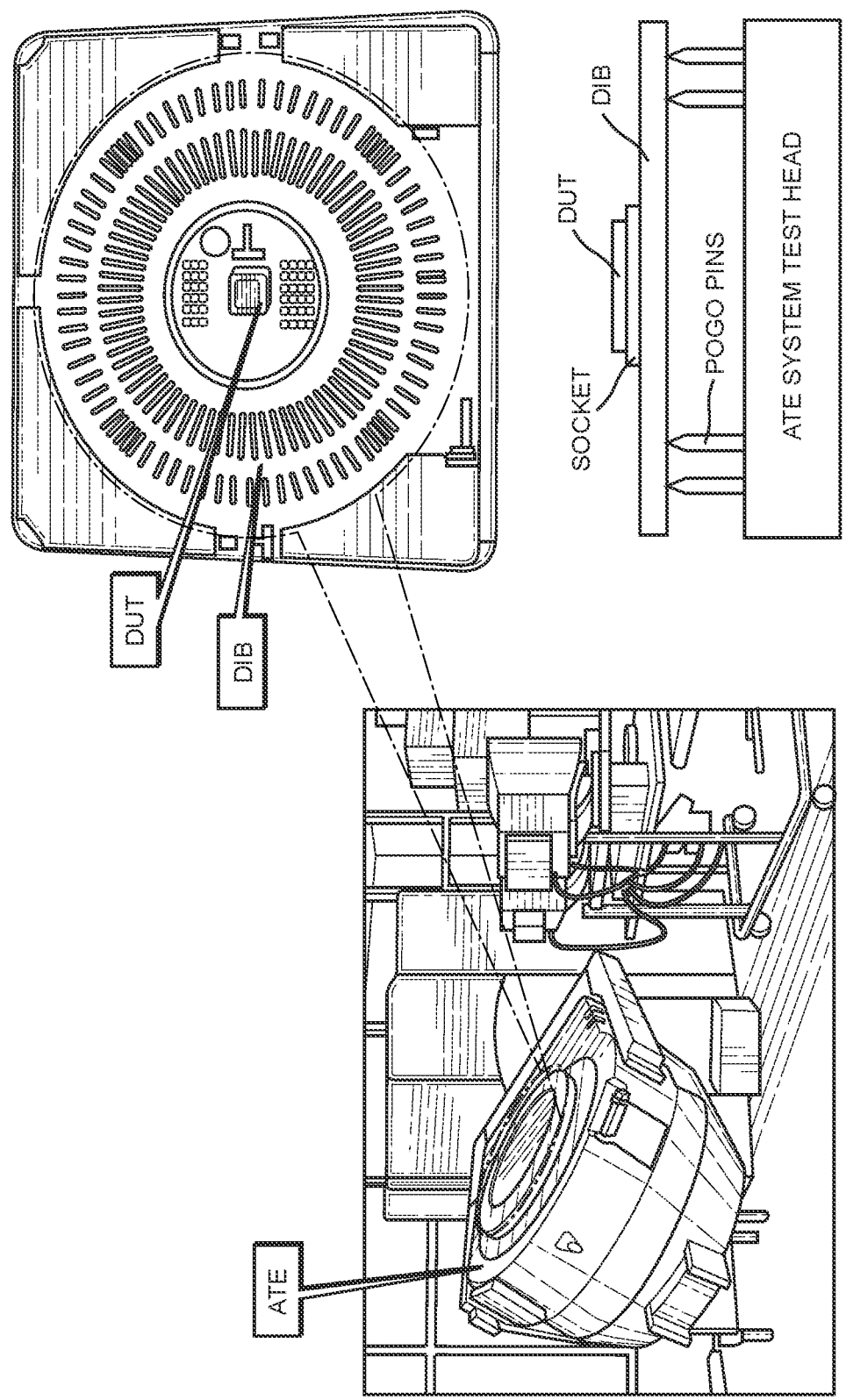
FIG. 1 illustrates an illustration of Automated Test Equipment (ATE) configured with a Digital Interface Board (DIB) that is in electrical contact with an integrated circuit Device Under Test (DUT)

FIG. 1 illustrates an illustration of Automated Test Equipment (ATE) configured with a Digital Interface Board (DIB) that is in electrical contact with an integrated circuit Device Under Test (DUT). As illustrated, the ATE is in contact with the DIB via an ATE system test head utilizing POGO pins to make electrical contact with the DIB.

Figure 2:
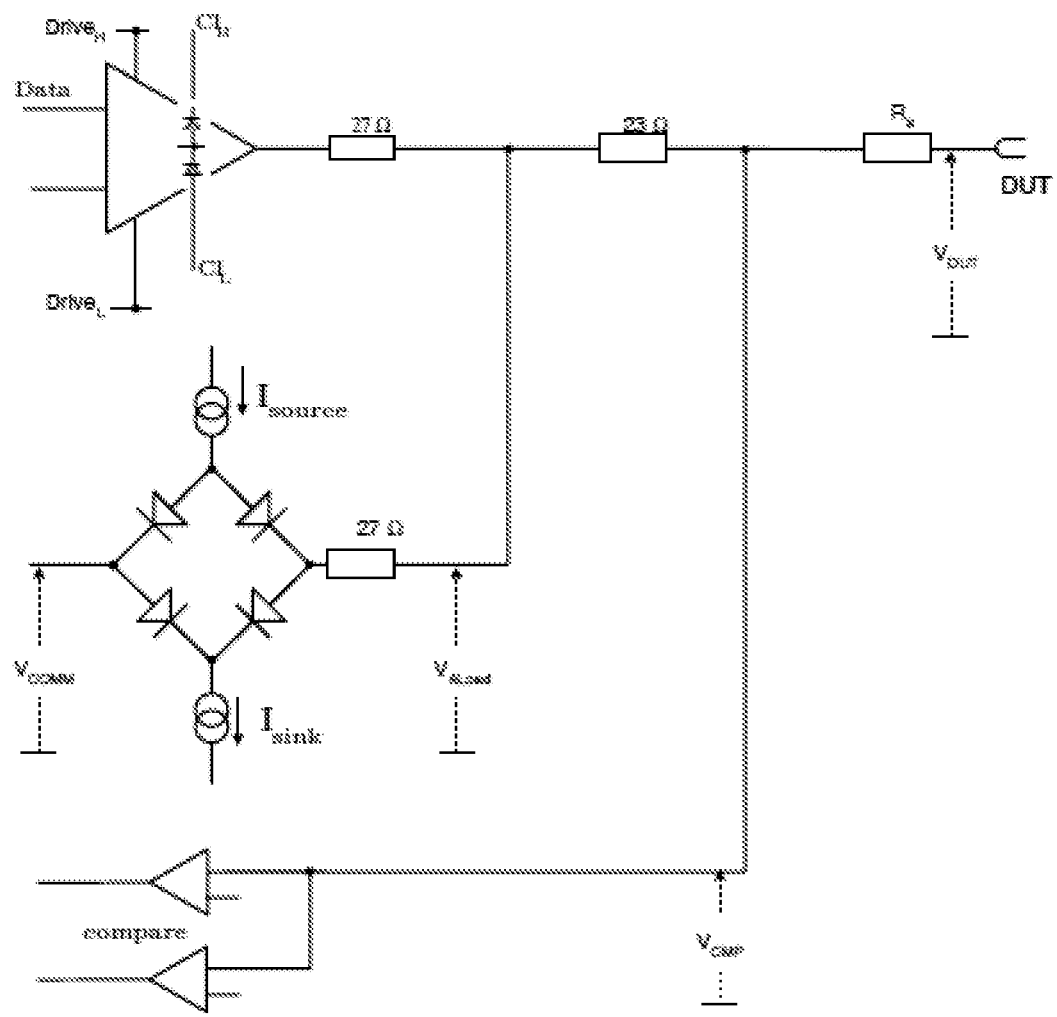
FIG. 2 illustrates a digital pin electronics (PE) resource used in the semiconductor tester.

The methodology described herein applies to semiconductor interface hardware testing. The method requires that the circuit to be tested is connected to a digital pin electronics (PE) resource in the semiconductor tester. A PE resource, illustrated in FIG. 2, has three basic components, including (1) a voltage driver, (2) a current load, and (3) a pair of voltage comparators. The voltage driver is used to send a digital voltage signal to the DUT. The current load provides a 50 Ohm load to a voltage source with a programmable current clamp. The voltage comparators sense the voltage and rapidly determine if it is above or below a programmed level. By having a pair of comparators, the sensed signal can be determined to be above both, below both, or between the pair depending on how they are programmed.

The primary purpose for Digital Pin Electronics is functional testing. This type of testing includes "Go/No Go", also referred to a "Pass/Fail" testing; and Binary Testing, e.g., "0 or 1". Another form of function testing includes High or Low (and sometimes Intermediate) testing. Functional testing is characterized by being repeatable and deterministic. Additionally, functional testing can change the voltage level, or sample the voltage level, twice as fast as the tester can drive the faster digital clock signal (two states per clock period).

A digital Pin Electronics (PE) resource does not make floating point measurements of voltage. A digital PE resource also does not drive a periodic analog waveform. Instead, the digital PE resource drives a square wave with two states. However, the digital PE can be programmed to perform more than "Go/No Go" functional testing. The three primary types of Functional Testing using digital Pin Electronics that are relevant to the novel methodology disclosed herein for determining an Impedance Response Profile are: (1) Digital Waveform Utility Testing; (2) Time Domain Reflectometry; and (3) Impedance Profiling.

A digital PE resource cannot make rapid analog (or floating point parametric) measurements of a voltage signal in the way that a digitizing oscilloscope does. The oscilloscope can capture the time domain waveform of a voltage signal in one pass, while a digital PE resource can only measure the signal to be high, low, or intermediate at each point in time where the signal is being measured. However, if the signal can be reproduced repeatedly, the digital PE resource can assemble a composited time domain waveform. The digital PE resource is designed to precisely repeat producing a voltage signal and measuring a voltage signal rapidly, in sequence, and precisely at the same times relative to a trigger event.

In digital IC testing, the DUT and tester must be synchronized, otherwise nothing is deterministic and no functional testing is possible. Thus, the DUT must be controlled to trigger an event repeatedly. If each time the event is triggered and the digital PE resource makes a comparison to given voltage threshold, then a composited waveform can be assembled. This is done by incrementally changing the time at which the signal is sampled along with the comparator voltage level. This process is similar to a shmoo plot where two parameters are incrementally varied while the test is repeated. In this case, the two variable parameters are sample time and voltage threshold.

For each sample time, the voltage threshold is changed incrementally from a low value to a high value. This allows the comparator to determine the voltage at which the result changes. This is the level of the voltage waveform at a point in time relative to the trigger. This entire sequence performed repeatedly at a single point in time can provide averaging to filter out random noise in the signal. Once all of the voltages have been executed at a single point in time, the sample time is incrementally increased and the entire sequence of the voltage sweep is repeated. The outcome is data that reproduces the time domain waveform of the signal arriving at the PE resource. It is a composited image from many repeated executions of the same triggered event.

The method described above is provided on some semiconductor testers as a software utility and is commonly referred to as a "digital waveform tool" or "digital waveform viewer." It is only useful for looking at the signal arriving from the DUT. In order to see the signal arriving at the DUT, an oscilloscope must be used.

A second method that is similar to that just described is the TDR (Time Domain Reflectometry) calibration of a digital interconnect circuit on a DIB. The method sends a voltage pulse down a 50 Ohm transmission line and looks for a reflection from the unterminated end of the transmission line. The round trip time from the pulse launching from the PE resource to the reflection returning is used in timing deskew calibration (alignment of signal timing between tester channels). Although this method does change the time and comparator voltage thresholds to identify when the reflection occurs, it does not build a composited time domain waveform. It is only an edge search algorithm with a single floating point number as the outcome.

When TDR is implemented using a pulse voltage source with a fast rise time and a digitizing oscilloscope, the result is referred to as "impedance profiling." This method sends a voltage pulse with a fast rise time down a transmission line and samples the voltage at the source. The original voltage pulse level is subtracted from the data. What remains is a history of the reflections as the pulse moves down the transmission line. The rise times of these TDR pulses can be faster than 50 ps. Based on the rise time and some other factors, the output from the system is plot showing the impedance of the transmission line along its entire length.

The three testing methods previously described are summarized below:
(1) Digital Waveform Tool
   Uses Digital Pin Electronics
   Composites Time Domain Waveform Originating at the DUT
   Uses Schmoo of Time and Voltage Comparator Level
(2) TDR Calibration for Timing Deskew
   Uses Digital Pin Electronics
   Launches TDR pulse and samples for a reflection from the unterminated end of the line
   Uses the Data for Timing Deskew to Align Signal Timing Between Tester Channels
(3) Impedance Profiling
   Performed by special bench test instruments (not on production IC testers)
   Launches TDR Pulse and Samples Analog Voltages Being Reflected Back to the Source In the development of the novel process for generating an Impedance Response Profile, the inventors have modified each of the three testing methods recited above, and then have combined the modified testing methods into a single novel process for generating an Impedance Response Profile. With regard to the Digital Waveform Tool, the method has been modified to launch the Composite Time Domain Waveform from the Pin Electronics (PE), instead of originating at the Device Under Test (DUT).

With regard to the TDE Calibration for Timing Deskew, the method has been modified so that a TDR pulse is not used and sampled for a reflection from the unterminated end of the line. Instead, an AC clock signal is launched and sampled and an integer multiple of the clock signals. Additionally, the modified Digital Waveform Tool has been further modified such that the data for timing deskew to align signal timing between tester channels is not used.

With regard to the Impedance Profiling, the method has been modified so that a TDR pulse is not used and analog voltages reflected back to the source are not sampled. Instead, the modified testing process launches a clock or signal pulse signal, and samples at discrete voltage thresholds a mix of the launched signal and reflections returning to the source. Additionally, the method does not use the data to construct an impedance profile along the entire transmission line path. Instead, the modified method uses the data to construct an impedance response profile. Furthermore, the modified method does not utilize special bench test instruments.

The inventive Impedance Response Profile Methodology utilizes the combination of the three inventor-modified testing methods. Three inventor-modified testing methods include:
(1) Digital Waveform Tool
   Uses Digital Pin Electronics
   Composites Time Domain Waveform Launched from the PE
   Uses Shmoo of Time and Voltage Comparator Level
(2) TDR Calibration for Timing Deskew
   Uses Digital Pin Electronics
   Launches an AC Clock Signal and Samples an Integer Multiple of the Clock Signals
(3) Impedance Profiling
   Launches a Clock or Single Pulse Signal and Samples at Discrete Voltage Thresholds a Mix of the Launched Signal and Reflections Returning to the Source
   Uses the Data to Construct an Impedance Response Profile The inventive Impedance Response Profile Methodology uses digital pin electronics. Additionally, no DUT need be present to perform the inventive Impedance Response Profile Methodology on the DIB. In other words, the methodology can be performed with or without a DUT in contact with the DIB. The methodology launches the highest frequency clock signal from the PE and samples a mix of the launched cloak signal and the reflected signal. This method also samples data to capture an integer number of clock periods, and uses shmoo of time and voltage at the voltage comparator level. The method composites a time domain waveform originating at the digital PE. The resulting date is used to baseline the time domain response of the circuit to a stimulus signal. A FFT of the periodic reflected signal is also calculated. Once the response of all circuit paths has been baselined, the tests are repeated at a later time and the results compared. The expected outcome of the comparison is that the results are identical, or are substantially similar within a predetermined specified tolerance. When the expected outcome is not compliant, then the DIB fails testing and is repaired, or replaced. A similar analysis can be performed using a single edge pulse. This is particularly true when the circuit being profiled is a simple transmission line with no components.

Figure 3:
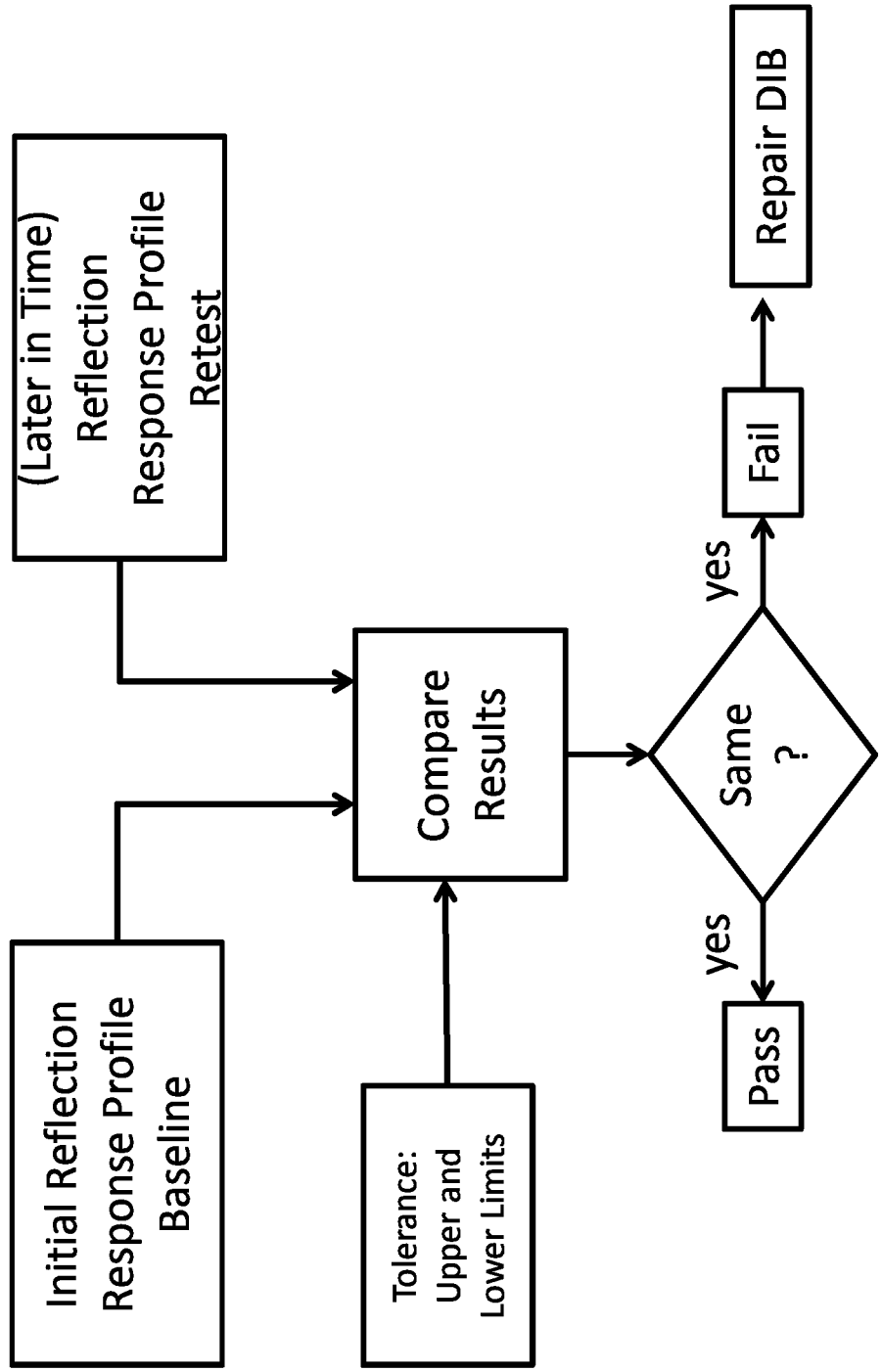
FIG. 3 illustration of a flowchart showing an overview of the Impedance Reflection Response Profile Methodology.

FIG. 3 is an illustration of a flowchart showing how the overall Initial Impedance Reflection Response Profile Methodology. This flowchart shows that an Initial Reflection Response Profile Baseline is established by executing the operations described herein to create an Initial Impedance Reflection Response Profile. At a later designated time, a second Reflection Response Profile Retest is conducted. Then, the Initial Reflection Response Profile and the Reflection Response Profile Retest generated by the retesting are compared to one another. The comparison will determine whether the Initial Profile and the Retest Profile are identical, within a predetermined tolerance zone having both an upper limit and a lower limit, or fall outside of the predetermined tolerance zone. When the comparison results are either the same or within the predetermined tolerance zone, the tested DIB is determined to have passed the Impedance Response Profile Method Test. Alternatively, when the comparison results fall outside of the predetermined tolerance zone, the tested DIB is determined to have failed the Impedance Response Profile Method Test. Thus, the tested DIB is either repaired or replaced with another DIB.

The inventive Impedance Response Profile Methodology is also referred to as "Impedance Response Profiling" or "IRP". IRP is NOT a digital waveform tool, TDR, or Impedance Profiling. More specifically, IRP is not a digital waveform tool. The digital waveform tool is used to measure a signal originating at the DUT. In contrast, IRP measures a mix of the launched signal(s) and the reflected signal(s). Digital Waveform Tools do not provide the user with a response tolerance envelope to determine if the circuit has drifted or has experienced catastrophic failure. This feature is only supported in analog waveform tools such as IRP. Thus, IRP is unique in this regard. Digital Waveform Tools evaluate the binary state of the digital signal relative to the voltage thresholds for VOL and VOH (high and low output from the DUT). In contrast, IRP evaluates the impedance response profile of the entire circuit between the digital PE and the first high impedance blocking component along the transmission line path.

IPR is NOT TDR. TDR is made with a single edge voltage pulse. In contrast, IPR method uses a clock signal. Additionally, IPR does not measure a round trip time to determine the length of the transmission lines as with TDR.

IPR is NOT IMPEDANCE PROFILING. IRP does not build an impedance profile in Ohms along the entire transmission line path as Impedance Profiling does. In contrast, IRP evaluates the impedance response to an AC stimulus signal of the entire circuit between the Digital PE and the first high impedance blocking component along the transmission line path.

The IPR methodology does not necessarily identify exactly what has failed or drifted out of compliance, or why the failure occurred. However, IPR does identify the tester channel where the problem exists. IPR also does identify whether something has changed in the operational characteristics of the DIB, and whether the DIB circuit under test is still compliant or is no longer compliant.

Based on SPICE simulation during the base-lining phase and considerations of the layout, a system for assigning probabilities to various root causes can be made. For example, consider a case where the only components in the path are a capacitor, contact resistance, and a transmission line. If this circuit fails compliance, the probability of specific component failure can be determined by MTBF rates for the three components. A computer-executed software application can be used to evaluate various factors, such things such as the net list, layout, component type, component specifications, SPICE simulations, MTFB, and others factors in making recommendations on what to check when a circuit is determined to be non-compliant.

At the conclusion of the Impedance Response Profiling process, the following IPR results indicate the following regarding the DIB:

When the retested response profile has not changed beyond the tolerances specified, then no problem with the signal path and attached components is indicated.

When the retested response profile has changed beyond the tolerances specified, then one or more of these two scenarios has occurred:

Catastrophic Failure—A catastrophic failure is usually related to an electrical short circuit, an electrical open circuit, and/or gross non-compliance with a critical electrical characteristic.

Parametric Drift in Component Electrical Characteristic—Parametric drift in a component electrical characteristic would include a change in the capacitance of a capacitor, a change in the resistance of a resistor, contact resistance in a switch, interconnect, etc., a change in the inductance of an inductor, and a change in the voltage threshold of a diode.

Figure 4:
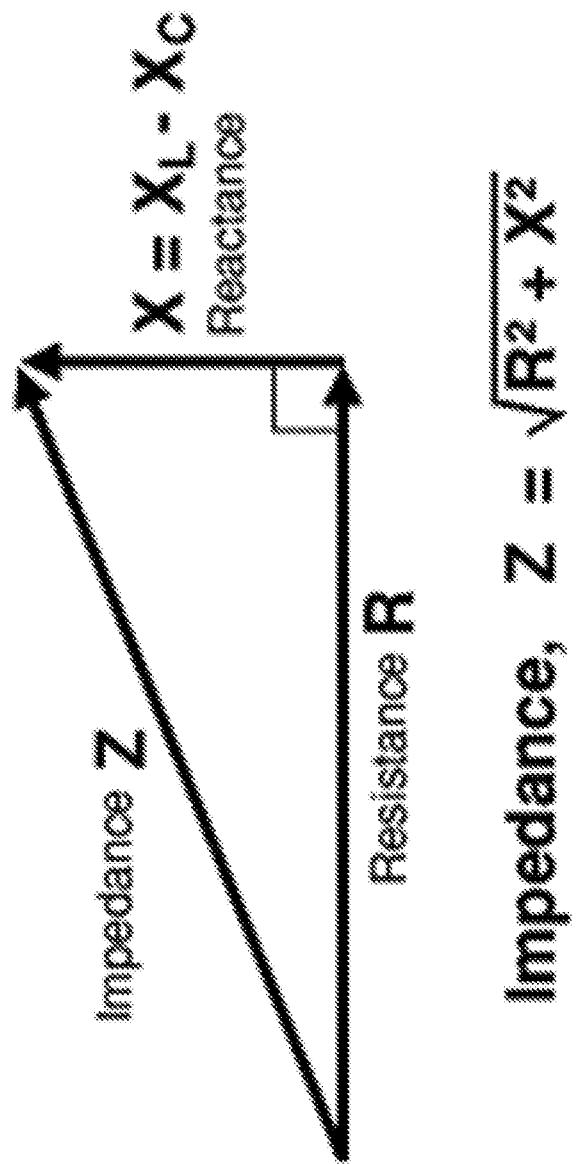
FIG. 4 illustrates how impedance is determined in circuits having passive elements, such as a resistor, a capacitor, and/or an inductor.

Even though no parametric measurements have been made, the IPR method is able to detect parametric drift in component electrical characteristics. The measurement is not an absolute measurement of a specific characteristic, but it none-the-less can detect a shift in impedance. In terms of electrical performance and signal integrity, this is often the most important characteristic, particularly with passive components, because it is based on resistance, capacitance, and inductance. So when any one of these drifts, it can be detected by measuring impedance. Impedance can be determined using the information provided in FIG. 4, which illustrates how impedance is determined in circuits having passive elements, such as a resistor, a capacitor, and/or an inductor.

When the clock signal method is used, an integer multiple of the fundamental period is sampled for the purpose of converting the time domain data to the frequency domain using FFT. This is referred to as coherent sampling. An integer multiple avoids sampling discontinuity which raises the noise floor of the FFT. Windowing can help, but it is most accurate to use coherent sampling and avoid windowing altogether. In some cases, differences in the time domain between a baselined response profile and a retest response profile may be difficult to detect while in the frequency domain it may be much easier.

IRP has a broad range of applications for the diagnosis of setup issues in electrical testing such as, but not limited to: (1) the testing of Pogo pins (contact resistance); (2) the testing of cable connectors (contact resistance); (3) determining cable damage (controlled impedance degradation);

(4) testing Pogo pin interface hardware at a wafer probe (contact resistance); (5) determining capacitor drift, short circuits, and open circuits; (6) determining inductor drift, short circuits, and open circuits; (7) determining resistor drift, short circuits, and open circuits; (8) testing a hard dock (contact resistance); (9) determining transmission line damage (controlled impedance degradation); (10) determining passive filter degradation (changes in RLC characteristics); and (11) crosstalk degradation.

SPICE Simulations can be used to illustrate how the IPR method works. Thus, four SPICE simulations of representative DIB transmission line circuits involving characteristics that can change over time creating non-compliance of the interface hardware are shown. The simulations show that the IRP method can easily detect drift in the electrical characteristics, including: (1) Contact Resistance (switch, Pogo pin, cable connector, etc.); (2) Capacitance of an AC Coupling Capacitor; (3) Series Diode; and (4) $1^{st}$ Order Low Pass RC Filter. The source is a 770 MHz, 600 ps rise/fall time digital clock signal. The voltage swing is 3.0V. Transmission lines are modeled as lossy. A factor in the sensitivity of the method is the rise/fall times of the stimulus signal. The faster the rise time, the more sensitive the method is to changes in the impedance of the circuit under test.

Simulation 1—Contact Resistance. This simulation shows the response of contact resistance (R5) to the voltage stimulus. Contact resistance is 0.1, 1.0, and 5 Ohm in the simulation. Transmission line lengths are 6 inches on either side of the contact resistance. Waveform measurements are made at the source. The source is a 770 MHz, 600 ps rise/fall time clock signal. The circuitry is illustrated in FIG. 5A, wherein the contact resistance R5 is shown as 0.1 Ohm. As stated above, the simulation was run three times with the contact resistances being 0.1 Ohm, 1.0 Ohm, and 5 Ohms. The resulting IPR contact resistance waveforms are shown in FIG. 5B and FIG. 5C. The waveform in FIG. 5B shows the voltage swing of the source to be approximately 3.0 Volts. The resulting IPR contact resistance waveform profiles are shown in FIG. 5C clearly illustrate the drift in resistance, as the contact resistance changes. In FIG. 5C, the voltage difference at peaks is 24 mV between 0.1 and 1 Ohm, and 86 mV between 1 and 5 Ohm.

Figure 6A:
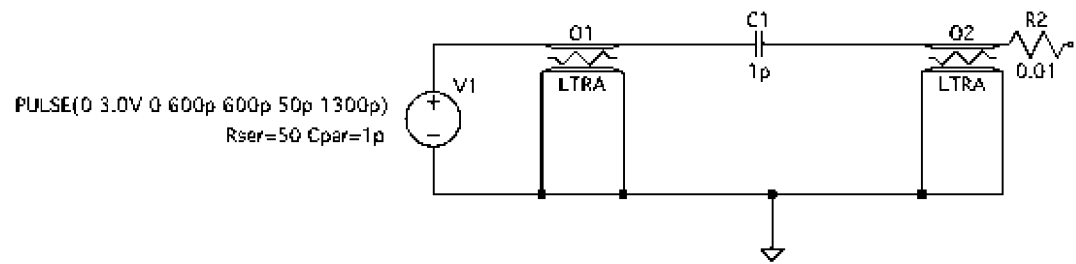
FIG. 6A illustrates circuitry used in a simulation to show the response of AC coupling capacitance to a voltage stimulus.

Simulation 2—AC Coupling Capacitance. This simulation shows the response of AC coupling capacitance (C1) to the voltage stimulus. Contact resistance is 1 pF, 2 pF, and 10 pF in the simulation. Transmission line lengths are 16 in (left) and 6 in (right) inches on either side of the capacitor. Waveform measurements are made at the source. The source is a 770 MHz, 600 ps rise/fall time clock signal. The circuitry is illustrated in FIG. 6A, wherein the AC Coupling Capacitance (C1) is shown as 1 pF. As stated above, the simulation was run three times with the AC Coupling Capacitances being 1 pF, 2 pF, and 10 pF. The resulting IPR AC Coupling Capacitance profiles are shown in FIG. 6B. The reflection response profiles are radically different and can easily detect shifts in capacitance of 1 pF.

Figure 7A:
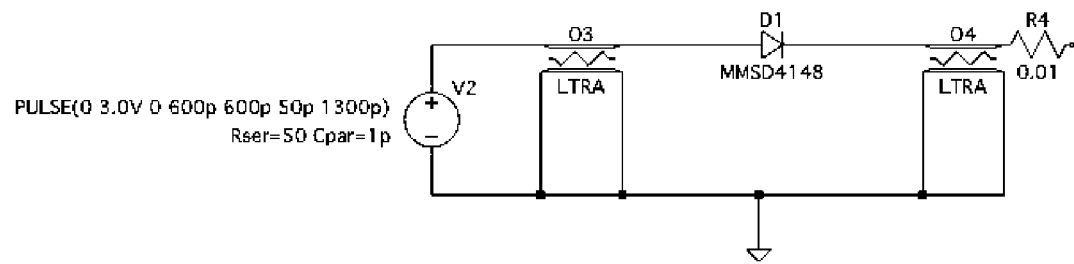
FIG. 7A illustrates circuitry used in a simulation to show the response of series diode to a voltage stimulus.

Simulation 3—Series Diode. This simulation shows the response of a series diode to the voltage stimulus. The diodes are MMSD4148 and 1N914 in the simulation. Transmission line lengths are 6 inches (left) and 0.25 inches (right) on either side of the capacitor. Waveform measurements are made at the source. The source is a 770 MHz, 600 ps rise/fall time clock signal. The circuitry is illustrated in FIG. 7A, wherein the series diode (D1) is MMSD4148. As stated above, the simulation was run two times with the series diode being a MMSD4148 Diode in one simulation and a 1N914 Diode a second simulation. In FIG. 7B, the IPR reflection response profiles are radically different, and can easily detect shifts in compliance.

Figure 8A:
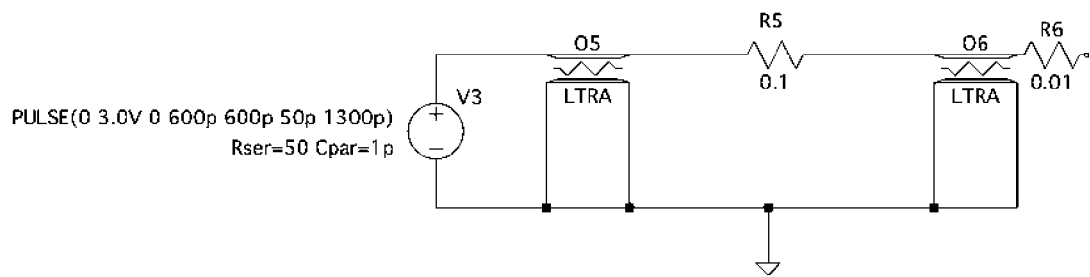
FIG. 8A illustrates circuitry used in a simulation to show the response of high pass RC filter to a voltage stimulus.

Simulation 4—High Pass RC Filter. This simulation shows the response of AC coupling capacitance to the voltage stimulus. Contact resistance is 1 pF, 2 pF, and 3 pF in the simulation. Transmission line lengths are 6 in (left) and 6 in (right) inches on either side of the capacitor. Waveform measurements are made at the source. The source is a 770 MHz, 600 ps rise/fall time clock signal. The circuitry is illustrated in FIG. 8A, wherein the series diode (D1) is MMSD4148. As stated above, the simulation was run two times with the series diode being a MMSD4148 Diode in one simulation and a 1N914 Diode a second simulation. In FIG. 8B, the IPR reflection response profiles are radically different, and can easily detect shifts in compliance. In FIG. 8B, the IPR reflection response profiles are radically different, and can easily detect shifts in compliance.

Figure 9:
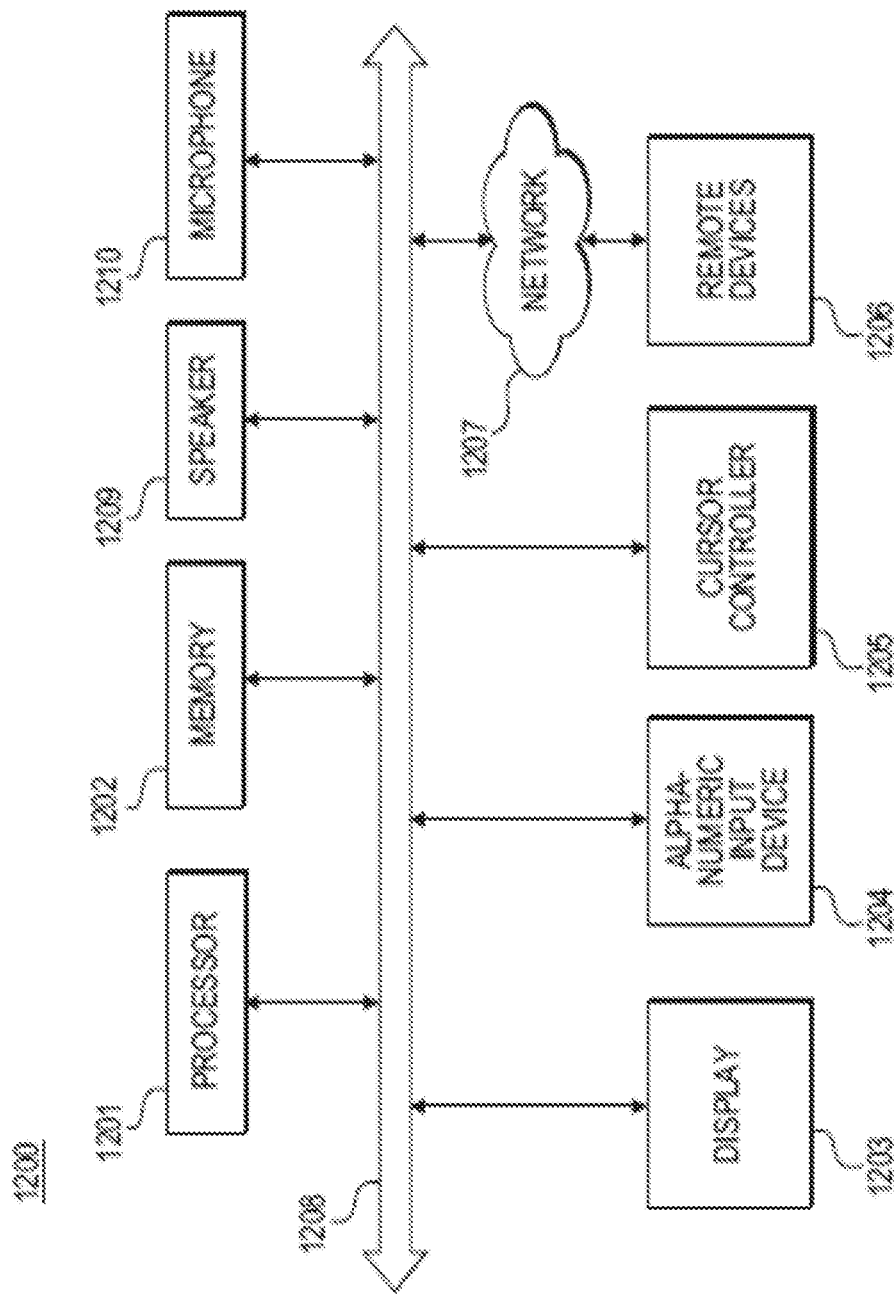
FIG. 9 illustrates an exemplary embodiment of a computer that may be used in the semiconductor testing process.

FIG. 9 illustrates an exemplary embodiment of a computer 1200 that may be used in the semiconductor testing process that utilizes automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 9, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for compliance testing of a Digital Interface Board, used by Automatic Test Equipment in testing of integrated circuit semiconductor devices, using Impedance Response Profiling, the method comprising:

launching, from Pin Electronics, alternating voltage digital clock signals from the Pin Electronics to one or more circuit paths in the Digital Interface Board;

sampling a mix of the launched alternating voltage digital clock signals and reflected signals returning from the one or more circuit paths in the Digital Interface Board;

compositing time domain waveforms originating at the Pin Electronics based on the sampling;

generating an initial reflection response profile baseline based on the compositing;

repeating the launching, the sampling, and the compositing at a later predetermined time;

generating a later reflection response profile based on the compositing repeated in the repeating;

comparing the initial reflection response profile baseline with the later reflection response profile; and
determining whether the one or more circuit paths in the Digital Interface Board are in compliance with predetermined operating standards based on the comparing.

2. The method of claim 1,
wherein the comparing includes determining whether the initial reflection response profile baseline and the later reflection response profile are identical.

3. The method of claim 1,
wherein the comparing includes determining whether the later reflection response profile is within a predetermined upper tolerance limit and a predetermined lower tolerance limit when compared to the initial reflection response profile baseline.

4. The method of claim 3,
wherein the comparing is executed by a digital processor.

5. The method of claim 3, further comprising:
repairing the Digital Interface Board in response to the one or more circuit paths being determined to be outside an acceptable tolerance zone located between the predetermined upper tolerance limit and the predetermined lower tolerance limit when the later reflection response profile is compared to the initial reflection response profile baseline.

6. The method of claim 5,
wherein the repairing of the Digital Interface Board includes determining a Mean Time Between Failure of each circuit element included in a circuit path determined to be outside of an acceptable tolerance range.

7. The method of claim 3, further comprising:
replacing the Digital Interface Board in response to the one or more circuit paths being determined to be outside an acceptable tolerance zone located between the predetermined upper tolerance limit and the predetermined lower tolerance limit when the later reflection response profile is compared to the initial reflection response profile baseline.

8. The method of claim 1,
wherein the Device Interface Board is compliance tested without any Device Under Test being in electrical contact with the Device Interface Board.

9. The method of claim 1,
wherein the Device Interface Board is compliance tested with one or more Devices Under Test being in electrical contact with the Device Interface Board.

10. The method of claim 1, further comprising:
determining a Fast Fourier Transform of the reflected signals,
wherein the initial reflection response profile baseline is generated further based on the determining of the Fast Fourier Transform, and
the later reflection response profile is generated further based on a further determining of the Fast Fourier Transform in the repeating.

11. The method of claim 1, further comprising:
determining whether a circuit path of the Digital Interface Board determined not to be in compliance with the predetermined operating standards has experienced a catastrophic failure.

12. The method of claim 11,
wherein the determining of whether the circuit path has experienced the catastrophic failure includes testing for an electrical short circuit, an electrical open circuit, and non-compliance of a critical electrical characteristic of a circuit element.

13. The method of claim 1, further comprising:
determining whether a circuit path of the Digital Interface Board determined not to be in compliance with the predetermined operating standards has experienced an unacceptable parametric drift of operating parameters.

14. The method of claim 13,
wherein the determining of whether the circuit path has experienced the unacceptable parametric drift of the operating parameters includes testing a capacitance of all capacitors, a resistance of resistors, an inductance of all inductors, a voltage threshold of all diodes, and a contact resistance of all switches and interconnects located in the circuit path.

15. A system for compliance testing of a Digital Interface Board used in testing of integrated circuit semiconductor devices, the system comprising:
Automatic Test Equipment (ATE), including at least one processor and an ATE System Test Head;
a Device Interface Board in electrical contact with the ATE System Test Head via POGO pins;
at least one test socket in the Device Interface Board for testing at least one Device under Test;
wherein the ATE is configured to perform the compliance testing of the Digital Interface Board, the compliance testing including:
launching, from Pin Electronics, alternating voltage digital clock signals via the Pin Electronics to one or more circuit paths in the Digital Interface Board;
sampling a mix of the launched alternating voltage digital clock signals and reflected signals returning from the one or more circuit paths in the Digital Interface Board;
compositing time domain waveforms originating via the Pin Electronics based on the sampling;
generating an initial reflection response profile baseline based on the compositing;
repeating the compliance testing, including the launching, the sampling, and the compositing, at a later predetermined time;
generating a later reflection response profile based on the compositing repeated in the repeating;
comparing the initial reflection response profile baseline with the later reflection response profile; and
determining whether the one or more circuit paths in the Digital Interface Board are in compliance with predetermined operating standards based on the comparing.

16. The system of claim 15,
wherein the comparing includes determining whether the initial reflection response profile baseline and the later reflection response profile are identical.

17. The system of claim 15,
wherein the comparing includes determining whether the later reflection response profile is within a predetermined upper tolerance limit and a predetermined lower tolerance limit when compared to the initial reflection response profile baseline.

18. The system of claim 15,
wherein the Device Interface Board is compliance tested without any Device Under Test being in electrical contact with the Device Interface Board.

19. The system of claim 15,
wherein the Device Interface Board is compliance tested with one or more Devices Under Test being in electrical contact with the Device Interface Board.

20. A non-transitory computer-readable storage medium that stores one or more computer programs, which, when executed by one or more processors in Automatic Test Equipment, cause the one or more processors to execute operations for compliance testing of a Digital Interface Board in testing of integrated circuit semiconductor devices, using Impedance Response Profiling, the operations including:

launching, from Pin Electronics, alternating voltage digital clock signals from the Pin Electronics to one or more circuit paths in the Digital Interface Board;

sampling a mix of the launched alternating voltage digital clock signals and reflected signals returning from the one or more circuit paths in the Digital Interface Board;

compositing time domain waveforms originating at the Pin Electronics based on the sampling;

generating an initial reflection response profile baseline based on the compositing;

repeating the compliance testing, including the launching, the sampling, and the compositing, at a later predetermined time;

generating a later reflection response profile based on the compositing repeated in the repeating;

comparing the initial reflection response profile baseline with the later reflection response profile; and determining whether the one or more circuit paths in the Digital Interface Board are in compliance with predetermined operating standards based on the comparing.

\* \* \* \* \*